(12) United States Patent
Padmanabhan Ramalekshmi Thanu et al.

(10) Patent No.: US 11,676,873 B2
(45) Date of Patent: Jun. 13, 2023

(54) SEMICONDUCTOR PACKAGE HAVING SEALANT BRIDGE

(71) Applicant: Intel Corporation, Santa Clara, CA (US)

(72) Inventors: Dinesh Padmanabhan Ramalekshmi Thanu, Chandler, AZ (US); Hemanth K. Dhavaleswarapu, Chandler, AZ (US); Venkata Suresh Guthikonda, Chandler, AZ (US); John J. Beatty, Chandler, AZ (US); Yonghao An, Chandler, AZ (US); Marco Aurelio Cartas Ayala, Chandler, AZ (US); Luke J. Garner, Chandler, AZ (US); Peng Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/614,765

(22) PCT Filed: Jun. 30, 2017

(86) PCT No.: PCT/US2017/040490
§ 371 (c)(1),
(2) Date: Nov. 18, 2019

(87) PCT Pub. No.: WO2019/005154
PCT Pub. Date: Jan. 3, 2019

(65) Prior Publication Data
US 2020/0185290 A1 Jun. 11, 2020

(51) Int. Cl.
*H01L 23/16* (2006.01)
*H01L 21/52* (2006.01)
(Continued)

(52) U.S. Cl.
CPC .............. *H01L 23/16* (2013.01); *H01L 21/52* (2013.01); *H01L 23/3675* (2013.01);
(Continued)

(58) Field of Classification Search
CPC ..... H01L 23/16; H01L 23/18; H01L 23/3675; H01L 23/42; H01L 25/165
See application file for complete search history.

(56) References Cited

U.S. PATENT DOCUMENTS

| 7,944,046 B2 * | 5/2011 | Chao | H01L 25/0655 |
| | | | 257/713 |
| 8,791,562 B2 * | 7/2014 | Lee | H01L 23/49827 |
| | | | 257/E21.59 |

(Continued)

OTHER PUBLICATIONS

International Search Report and Written Opinion for International Patent Application No. PCT/US2017/040490 dated Mar. 29, 2018, 12 pgs.
International Preliminary Report on Patentability for International Patent Application No. PCT/US2017/040490, dated Jan. 9, 2020, 9 pages.

*Primary Examiner* — Mark W Tornow
*Assistant Examiner* — Abbigale A Boyle
(74) *Attorney, Agent, or Firm* — Schwabe, Williamson & Wyatt, P.C.

(57) ABSTRACT

Semiconductor packages having a sealant bridge between an integrated heat spreader and a package substrate are described. In an embodiment, a semiconductor package includes a sealant bridge anchoring the integrated heat spreader to the package substrate at locations within an overhang gap laterally between a semiconductor die and a sidewall of the integrated heat spreader. The sealant bridge extends between a top wall of the integrated heat spreader and a die side component, such as a functional electronic component or a non-functional component, or a satellite chip on the package substrate. The sealant bridge modulates (Continued)

warpage or stress in thermal interface material joints to reduce thermal degradation of the semiconductor package.

17 Claims, 7 Drawing Sheets

(51) Int. Cl.
*H01L 23/367* (2006.01)
*H01L 23/498* (2006.01)
*H01L 23/538* (2006.01)
*H01L 25/065* (2023.01)
*H01L 25/16* (2023.01)
*H01L 23/00* (2006.01)
*H01L 25/18* (2023.01)

(52) U.S. Cl.
CPC .... *H01L 23/49816* (2013.01); *H01L 23/5383* (2013.01); *H01L 25/0655* (2013.01); *H01L 25/165* (2013.01); *H01L 24/32* (2013.01); *H01L 24/48* (2013.01); *H01L 25/18* (2013.01); *H01L 2224/32245* (2013.01); *H01L 2224/48091* (2013.01); *H01L 2224/48106* (2013.01); *H01L 2224/48227* (2013.01); *H01L 2924/19041* (2013.01); *H01L 2924/19105* (2013.01)

(56) References Cited

U.S. PATENT DOCUMENTS

| | | | |
|---|---|---|---|
| 9,041,192 B2* | 5/2015 | Saeidi | H01L 23/42 257/710 |
| 9,257,418 B2* | 2/2016 | Lee | H01L 23/367 |
| 10,236,229 B2* | 3/2019 | Gandhi | H01L 23/562 |
| 2005/0091844 A1 | 5/2005 | Sathe et al. | |
| 2009/0001528 A1 | 1/2009 | Braunisch et al. | |
| 2009/0127700 A1* | 5/2009 | Romig | H01L 23/4334 257/E23.101 |
| 2011/0018125 A1* | 1/2011 | Loo | H01L 23/16 257/706 |
| 2012/0018871 A1 | 1/2012 | Lee et al. | |
| 2013/0168846 A1 | 7/2013 | Houle et al. | |
| 2014/0061893 A1* | 3/2014 | Saeidi | H01L 21/52 257/712 |
| 2015/0001701 A1* | 1/2015 | Li | H01L 23/3737 257/713 |
| 2015/0170989 A1* | 6/2015 | Dhavaleswarapu | H01L 23/3675 257/712 |
| 2016/0163657 A1* | 6/2016 | Hung | H01L 21/4803 438/107 |
| 2016/0225742 A1* | 8/2016 | Davis | H01L 24/92 |

* cited by examiner

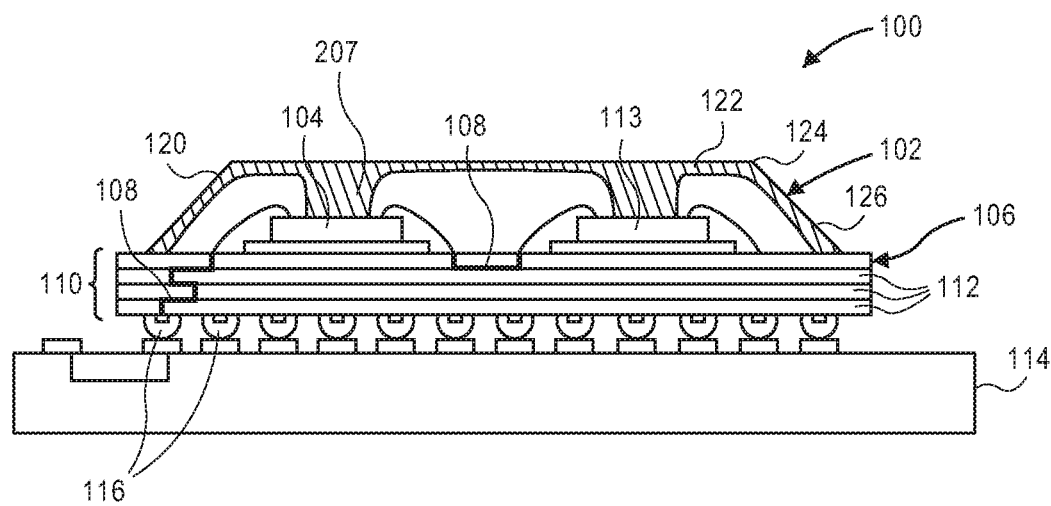
Figure 1
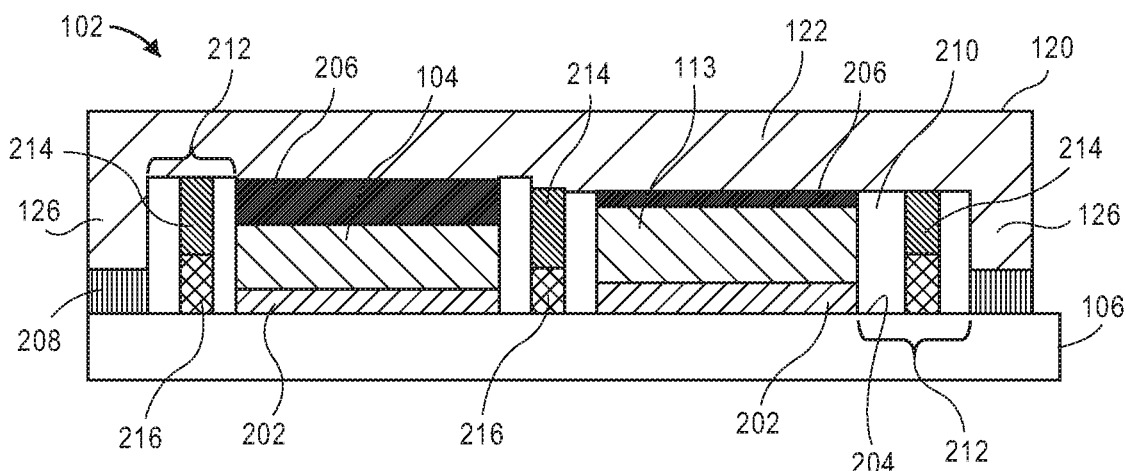
Figure 2
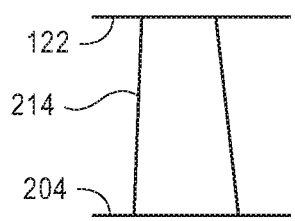 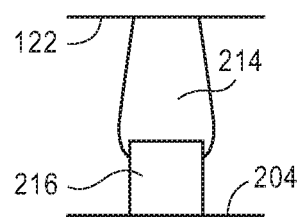 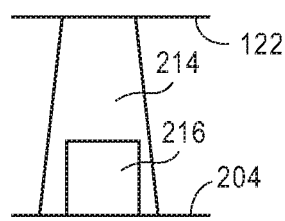
Figure 3A  Figure 3B  Figure 3C

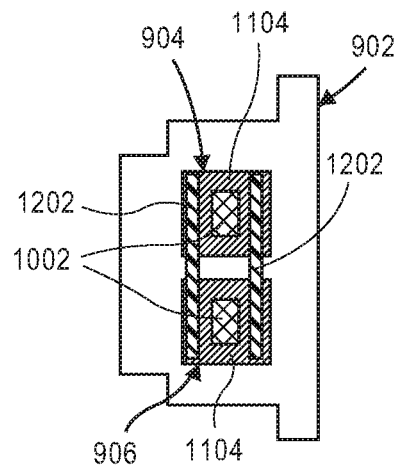 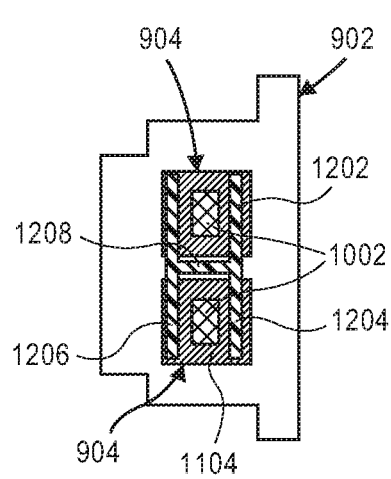 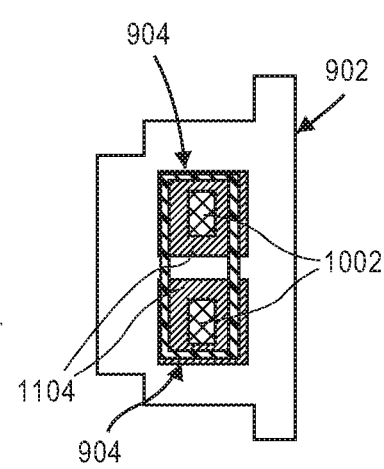
Figure 12A    Figure 12B    Figure 12C
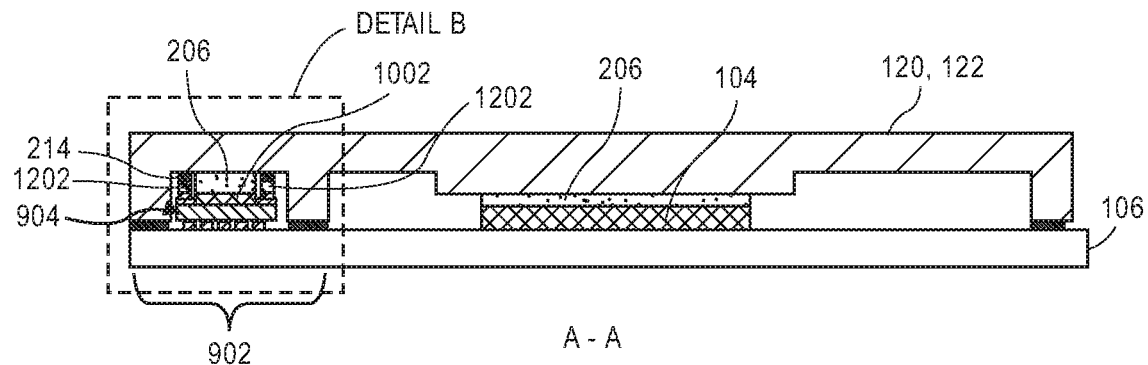
Figure 13
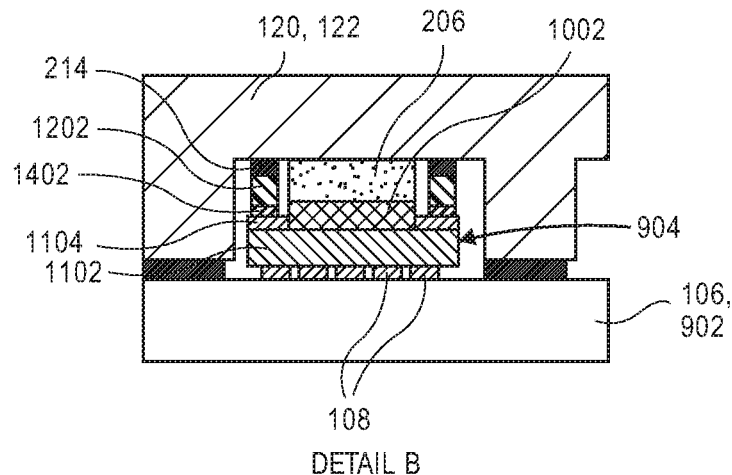
Figure 14

SEMICONDUCTOR PACKAGE HAVING SEALANT BRIDGE

CROSS-REFERENCE TO RELATED APPLICATION

This patent application is a U.S. National Phase Application under 35 U.S.C. § 371 of International Application No. PCT/US2017/040490, filed Jun. 30, 2017, entitled "SEMICONDUCTOR PACKAGE HAVING SEALANT BRIDGE," which designates the United States of America, the entire disclosure of which is hereby incorporated by reference in its entirety and for all purposes.

FIELD OF THE INVENTION

Embodiments are in the field of integrated circuit packages and, in particular, semiconductor packages having integrated heat spreaders mounted on package substrates.

BACKGROUND OF THE INVENTION

Multi-chip packages (MCP) include several silicon chips placed in a single semiconductor package. For example, MCP solutions can include on-package integration of central processing unit (CPU), field programmable gate array (FPGA), transceiver, and memory chips. On-package integration of several chips can accelerate communication between chips, e.g., between a CPU and surrounding chips. Accordingly, there is demand for MCP solutions to satisfy an ever-increasing need for faster computing and higher bandwidths. Each chip of an MCP, however, generates heat and the heat is typically dissipated in some manner. For example, each chip may be in thermal communication with an integrated heat spreader via a thermal interface material. The integrated heat spreader functions to dissipate heat from the chip dies to a surrounding environment during operation of the MCP.

BRIEF DESCRIPTION OF THE DRAWINGS

FIG. 1 illustrates a cross-sectional view of a semiconductor package assembly including a semiconductor package having a sealant bridge between an integrated heat spreader and a package substrate, in accordance with an embodiment.

FIG. 2 illustrates a semiconductor package having a sealant bridge between an integrated heat spreader and a package substrate, in accordance with an embodiment.

FIGS. 3A-3C illustrate sealant bridges between an integrated heat spreader and a package substrate, in accordance with an embodiment.

FIGS. 12A-12C illustrate cross-sectional views of a stiffener of a satellite chip mounted on a package substrate, in accordance with an embodiment.

FIG. 13 illustrates a cross-sectional view, taken about line A-A of FIG. 9, of a semiconductor package having a sealant bridge between an integrated heat spreader and a stiffener of a satellite chip mounted on a package substrate, in accordance with an embodiment.

FIG. 14 illustrates a detail view, taken from Detail B of FIG. 13, of a semiconductor package having a sealant bridge between an integrated heat spreader and a stiffener of a satellite chip mounted on a package substrate, in accordance with an embodiment.

DETAILED DESCRIPTION OF THE INVENTION

Figure 4:
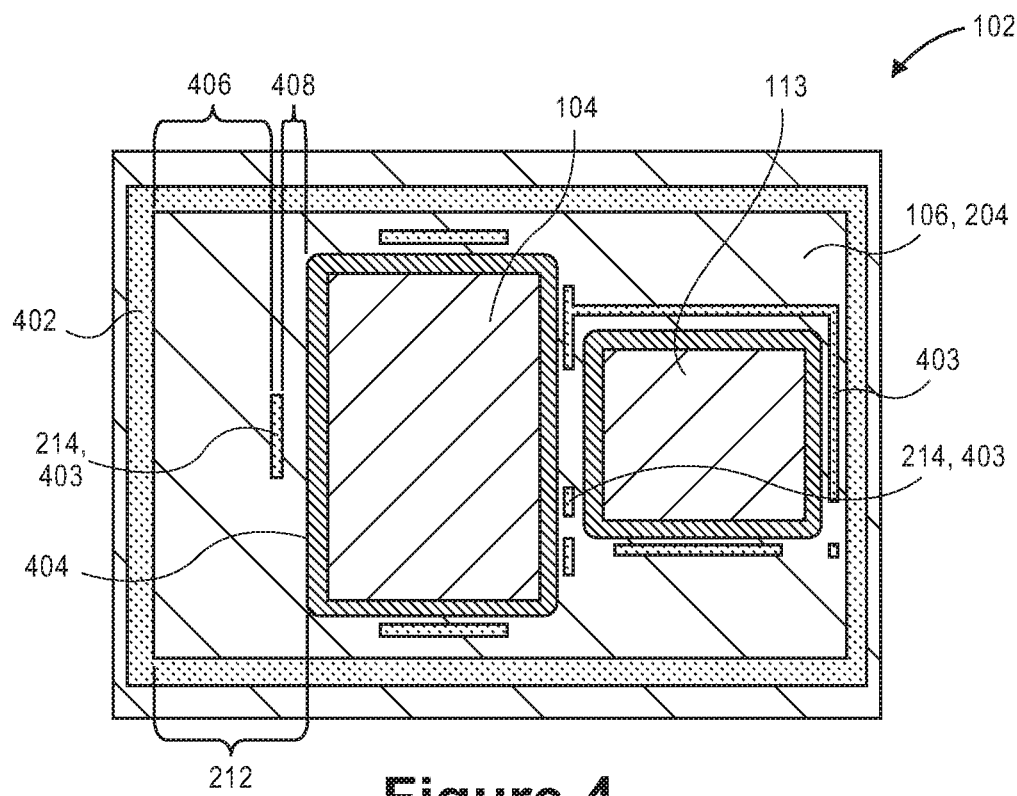
FIG. 4 illustrates a cross-sectional view of a sealant bridge extending around a portion of a perimeter of a semiconductor die, in accordance with an embodiment.

Semiconductor packages having a sealant bridge between an integrated heat spreader and a package substrate are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

For several reasons, on-package integration of multiple chips in multi-chip packages (MCP) can increase stresses in thermal interface material (TIM) joints attaching the chips to an integrated heat spreader. For example, each chip can experience respective expansion/contraction during use, and the dynamic warpage can cause imbalanced stresses in the TIM joints. Also, variations in package tolerances of the chips can create wide variations in TIM thicknesses, which can cause imbalanced stresses in the TIM joints. Furthermore, protruding portions of a package substrate supporting a chip, also known as a "diving board," can deflect more than other regions of the package substrate, which can cause imbalanced stresses in the TIM joints. For any of the above reasons, mechanical stress at a TIM joint between an integrated heat spreader and a chip of an MCP can be three times higher than similar joints in single chip packages. The higher stresses can lead to higher thermal degradation of the TIM joints. Reliability testing has shown that thermal resistance increases nonlinearly with increased TIM stress over a product lifespan. More particularly, thermal resistance has been shown to increase threefold from a beginning-of-life of an MCP to an end-of-life of the MCP based on thermal cycling tests conducted at temperatures between −40 to 100 degrees Celsius. Accelerated bake testing at 125 degrees Celsius to mimic product use has also indicated thermal degradation between the beginning-of-life and the end-of-life of the MCP. In short, existing MCP solutions experience substantial thermal degradation over time, which shifts the burden of cooling the semiconductor package onto cooling solutions, e.g., fans, or surrounding components, e.g., heat sinks. Accordingly, existing MCP solutions have higher component costs than would otherwise be the case if stresses in the TIM joints are reduced.

Stresses in TIM joints of MCP solutions can be reduced in several ways. For example, reducing a distance between a chip and a leg of the integrated heat spreader can reduce warpage and TIM stress. Design rules, keep-out-zones, and manufacturing limitations, however, can limit how close the integrated heat spreader leg can be placed to the chip. TIM stress can be reduced by adding features to the integrated heat spreader. Such features, however, can increase product manufacturing costs. Reducing TIM stress through modifications to substrate properties, such as a coefficient of thermal expansion of the package substrate layers, can also increase manufacturing material costs. Accordingly, a manner of reducing stresses in, and thermal degradation of, TIM joints of a semiconductor package is needed that has minimal increased manufacturing and product costs.

In an aspect, a semiconductor package having one or more semiconductor dies has sealant bridges that minimize the mechanical stresses induced by dynamic warpage. The sealant bridges can also limit deflection, and therefore stress, in certain areas of the package substrate, such as at diving board regions. The semiconductor package can incorporate one or more die side components (DSC), e.g., capacitors, or a satellite chip between an integrated heat spreader and a package substrate. The DSC and/or the satellite chip may act as an anchoring point between an integrated heat spreader and an underlying portion of the MCP. More particularly, the sealant bridges may extend between the integrated heat spreader and the DSC (or the satellite chip) to anchor the integrated heat spreader to the package substrate. Sealant bridges may be selectively located between the semiconductor die(s) and a sidewall of the integrated heat spreader to reduce die overhang, e.g., a span between a TIM joint and a point where the integrated heat spreader is anchored. Similarly, the satellite chips may be anchored to the integrated heat spreader to limit mechanical strain in the TIM joint. The reduced span can lower dynamic warpage in the region of the semiconductor die, and thus, reduce TIM stress. Similarly, reducing strain in the TIM joint can reduce TIM stress. Accordingly, the sealant bridges can lower thermal degradation of the semiconductor package.

Referring to FIG. 1, a cross-sectional view of a semiconductor package assembly is shown in accordance with an embodiment. A semiconductor package assembly 100 may include one or more semiconductor packages 102 having semiconductor die(s) 104. For example, semiconductor package 102 may be a MCP having several semiconductor dies 104 mounted on a package substrate 106.

Semiconductor die(s) 104 may be electrically connected to each other or to external components by intervening structures, such as electrical interconnects 108. Electrical interconnects 108 may, for example, be incorporated in a build-up laminate 110 of package substrate 106. More particularly, electrical interconnects 108 may include copper traces embedded and/or attached to one or more dielectric layers 112 of the build-up laminate 110. Electrical interconnects 108 may be electrically connected to other interconnect structures of dielectric layer 112, such as electrical vias. Accordingly, semiconductor die 104 may be electrically connected to electrical interconnect 108 through one or more intervening interconnect structures, and furthermore, semiconductor die 104 may be electrically connected to other components, such as a second semiconductor die 113 or a printed circuit board assembly 114 of semiconductor package assembly 100, through electrical interconnect 108.

In an embodiment, semiconductor package 102 is mounted on printed circuit board 114 to form semiconductor package assembly 100. Electrical interconnections between semiconductor die 104, package substrate 106, and printed circuit board 114 may include solder balls 116 and or other metallic bump, trace, or wire interconnects, e.g., wire bonds between semiconductor die 104 and electrical contacts on package substrate 106. By way of example, semiconductor package 102 of semiconductor package assembly 100 may be a ball grid array (BGA) component having several solder balls 116 arranged in a ball field. That is, an array of solder balls 116 may be arranged in a grid or other pattern. Each solder ball 116 may be mounted and attached to a corresponding contact pad of printed circuit board 114. Printed circuit board 114 may be a motherboard or another printed circuit board of a computer system or device, e.g., a server or a workstation. Printed circuit board 114 may include signal routing to external device connectors (not shown). Accordingly, the solder ball and contact pad attachments may provide an electrical interface between semiconductor die(s) 104, 113 of semiconductor package 102 and an external device.

Semiconductor package assembly 100 may include an integrated heat spreader 120 mounted on package substrate 106. A geometry of integrated heat spreader 120 may include a top wall 122 to transfer heat from semiconductor die(s) 104 within semiconductor package 102 to a surrounding environment or component. More particularly, top wall 122 may be in direct contact with semiconductor die(s) 104 or in thermal contact with semiconductor die(s) 104 via an intervening structure, e.g., a TIM layer. Top wall 122 may extend laterally over die(s) 104, and may have an underside facing an upper surface of die(s) 104. The underside may be jointed to the upper surface by TIM.

Top wall 122 may extend laterally and be surrounded by a peripheral edge 124, e.g., an outer edge of integrated heat spreader 120. A sidewall 126 may be contiguously connected to top wall 122 at the peripheral edge 124. Sidewall 126 may extend from peripheral edge 124 to package substrate 106. Accordingly, package substrate 106 may be attached to integrated heat spreader 120 at sidewall 126. In an embodiment, sidewall 126 extends between top wall 122 and a top surface of package substrate 106. Sidewall 126 can extend laterally around semiconductor die(s) 104 to enclose semiconductor die(s) 104 between integrated heat spreader 120 and package substrate 106. In an embodiment, sidewall 126 extends laterally around an entire periphery of top wall 122. In an embodiment, sidewall 126 extends laterally around only a portion of the periphery of top wall 122. For example, sidewall 126 may have one or more discontinuities, e.g., holes or gaps, in the lateral direction to place a space between integrated heat spreader 120 and package substrate 106 in fluid communication with a surrounding environment. The discontinuities can allow outgassing from the internal space to the surrounding environment. Integrated heat spreader 120 may be formed from a flat sheet of material that is bent along peripheral edge 124 to form top wall 122 above the semiconductor die(s) 104 and sidewall 126 laterally around the semiconductor dies 104. There may be a physical connection between integrated heat spreader 120 and package substrate 106 along a lower edge of sidewall 126.

Referring to FIG. 2, a semiconductor package having a sealant bridge between an integrated heat spreader and a package substrate is shown in accordance with an embodiment. Semiconductor package 102 may be a MCP incorporating several semiconductor dies 104 used to perform various computing functions. By way of example, semiconductor die 104 may be a central processing unit (CPU) die and second semiconductor die 113 may be a field programmable gate array (FPGA) die. Similarly, semiconductor package 102 may include one or more other chipsets, graphics devices, wireless devices, application-specific integrated circuits, etc. CPU die 104 and FPGA die 113 may be physically and electrically connected to package substrate 106 through respective interconnects. For example, each die may have a respective first layer interconnect 202 attached to a top surface 204 of package substrate 106. Thus, semiconductor package 102 may be incorporated in a computer system to perform various computing operations, and as a result, the semiconductor dies 104, 113 of semiconductor package 102 may generate heat.

Integrated heat spreader 120 may transfer heat from CPU die 104 and/or FPGA die to a heat sink (not shown). Accordingly, integrated heat spreader 120 may sit on top of the silicon dies and may be thermally connected to the dies by a respective thermal interface material (TIM) layer 206. TIM layers 206 may include a thermal interface material paste that incorporates thermally conductive fillers. For example, TIM layer 206 may include a polymer TIM material. Thus, TIM layer 206 may physically and thermally connect CPU die 104 and/or FPGA die 113 to integrated heat spreader 120. Likewise, TIM layer 206 may be disposed between integrated heat spreader 120 and the heat sink to physically and thermally connect top wall 122 of integrated heat spreader 120 to heat sink. In addition to a heat sink, the computer system may include additional heat transfer components, such as forced air coolers, fans, thermoelectric coolers, etc., to remove heat from heat sink and semiconductor package 102.

Integrated heat spreader 120 may have a complex geometry. For example, top wall 122 of integrated heat spreader 120 may include one or more pedestal 207 (FIG. 1) to make contact with underlying semiconductor dies 104 having different heights above package substrate 106. Similarly, top wall 122 may have several thicknesses. More particularly, a vertical gap between top wall 122 of integrated heat spreader 120 and an upper surface of semiconductor die(s) 104, and/or top surface 204 of package substrate 106, may vary. For example, a first section of top wall 122 over CPU die 104 may be over a first cavity having a first height, and a second section of top wall 122 over FPGA die 113 may be over a second cavity 210 having a second height less than the first height. Similarly, thicknesses of the respective semiconductor dies 104, TIM layers 206, and first layer interconnects 202 may vary. By way of example, CPU die 104 and first layer interconnect 202 of CPU die 104 may have respective thicknesses of 764 micron and 45 micron. By contrast, FPGA die 113 and first layer interconnect 202 of FPGA die 113 may have respective thicknesses of 790 micron and 65 micron. Accordingly, TIM layer 206 connecting CPU die 104 to integrated heat spreader 120 may be thicker than TIM layer 206 connecting FPGA die 113 to integrated heat spreader 120.

In an embodiment, sidewall 126 is between top wall 122 and top surface 204. For example, top wall 122 may be over semiconductor dies 104, 113 and sidewall 126 may extend downward from top wall 122 to top surface 204. Furthermore, sidewall 126 may extend laterally around semiconductor dies 104, 113. Sidewall 126 may be attached to package substrate 106 by a sealant bead 208 extending along a bottom edge of sidewall 126 between sidewall 126 and top surface 204. Accordingly, integrated heat spreader 120 may be adhered to top surface 204 using adhesive or thermal bonding techniques. When integrated heat spreader 120 is attached to package substrate 106, semiconductor dies 104, 113 may be enclosed within a cavity 210. Cavity 210 has a lateral width between dimensionally opposed locations on sidewall 126, and a vertical height between top wall 122 and top surface 204.

Each semiconductor die 104 of semiconductor package 102 can be separated from sidewall 126 by an overhang gap 212. Overhang gap 212 is a lateral distance between an edge of semiconductor die 104 and an edge of integrated heat spreader 120. More particularly, overhang gap 212 is a distance between an outer lateral surface of semiconductor die 104 and an inner lateral surface of sidewall 126. Each semiconductor die 104 of semiconductor package 102 has one or more overhang gap 212. For example, in the case of semiconductor die 104 having a rectangular profile, each of four outer lateral surfaces can face in a respective direction toward a respective inner lateral surface of sidewall. The spans between the respective die surfaces and sidewall 126 surfaces represent respective overhang gaps 212. Higher spans may cause greater warpage. More particularly, it has been shown that MCP solutions having larger overhang gaps 212 tend to have higher warpage, and thus, experience higher TIM stress and thermal degradation during a lifetime of the product usage.

In an embodiment, semiconductor package 102 includes one or more sealant bridges 214 within one of the overhang gaps 212. For example, a first sealant bridge 214 may be within overhang gap 212 laterally between the CPU stack (having CPU die 104) and sidewall 126. A second sealant bridge 214 may be within overhang gap 212 laterally between FPGA die 113 and sidewall 126. Furthermore, a third sealant bridge 214 may be within an overhang gap 212 laterally between CPU die 104 and FPGA die 113. More particularly, sealant bridge 214 may connect top wall 122 to top surface 204 at any location within cavity 210. Accordingly, a maximum lateral span between semiconductor die 104 and a joint between integrated heat spreader 120 and package substrate 106 is minimized by sealant bridge 214.

Top wall 122 may be coupled to top surface 204 by sealant bridge 214 and/or one or more intervening structures. For example, sealant bridge 214 can extend between top wall 122 and a die side component (DSC) 216 mounted on top surface 204, as shown in FIG. 2 at the location between CPU die 104 and the leftward sidewall 126. Alternatively, sealant bridge 214 can extend between top wall 122 and top surface 204, as shown in FIG. 2 at the location between FPGA die 113 and the rightward sidewall 126. Sealant bridges 214 may have a variety of architectures, as described below.

Referring to FIG. 3A, a sealant bridge between an integrated heat spreader and a package substrate is shown in accordance with an embodiment. Sealant bridge 214 can extend vertically between an underside of top wall 122 and top surface 204 of package substrate 106. Sealant bridge 214 may fill the entire gap between top wall 122 and top surface 204. Sealant bridge 214 can form a wall having a thickness in a horizontal or lateral direction.

Sealant bridge 214 may be formed from a sealant material, such as an epoxy, an underfill material, etc. The sealant material may be viscous when dispensed into cavity 210. After curing, the sealant material may stiffen. For example, sealant may be a snap cure sealant that cures quickly, a stiff sealant that has a high modulus after curing, or any other adhesive material.

Referring to FIG. 3B, a sealant bridge between an integrated heat spreader and a DSC 216 mounted on a package substrate is shown in accordance with an embodiment. Semiconductor package 102 may include DSC 216 mounted on top surface 204 of package substrate 106. For example, as described above, DSC 216 may be mounted on package substrate 106 within overhang gap 212 between dies and/or between a die 104 and sidewall 126.

DSC 216 may be a functional electronic component. For example, DSC 216 may be a capacitor mounted on package substrate 106 beside semiconductor die 104. DSC 216 may be a contact pad on top surface 204. In an embodiment, DSC 216 is a nonfunctional component. For example, DSC 216 may be a dummy component located in cavity 210. The dummy component may be a piece of copper, aluminum, ceramic, etc., and the dummy component may be sized similar to a capacitor. Accordingly, DSC 216 may be a functional or nonfunctional anchoring point to mount sealant bridge 214 between top surface 204 and top wall 122.

In an embodiment, sealant bridge 214 extends between top wall 122 of integrated heat spreader 120 and an upper surface of DSC 216. Sealant bridge may fill the entire gap between top wall 122 and the upper surface of DSC 216. Sealant bridge 214 may occupy the upper surface of DSC and/or may extend partially around a sidewall 126 of DSC. Sealant bridge 214 may be a column extending vertically between the upper surface of DSC and top wall 122.

Referring to FIG. 3C, a sealant bridge encapsulating a DSC between an integrated heat spreader and a package substrate is shown in accordance with an embodiment. Sealant bridge 214 can extend fully around the sidewall of DSC 216. For example, sealant bridge 214 may be dispensed on the upper surface of DSC 216 and the sealant material may flow over and around the upper surface and the sidewall of DSC 216 to fill a gap between top surface 204 and top wall 122. Accordingly, DSC 216 may be encapsulated between sealant bridge 214 and top surface 204.

Referring to FIG. 4, a cross-sectional view of a sealant bridge extending around a portion of a perimeter of a semiconductor die is shown in accordance with an embodiment. Semiconductor package 102 can include a heat spreader joint 402 extending along an outer region of top surface 204 of package substrate 106. Heat spreader joint may connect sidewall 126 to package substrate 106, and thus, may have a same profile as an underside of sidewall 126. For example, heat spreader joint 402 may join a rectangular integrated heat spreader 120 to package substrate 106, and may include a profile having width and length dimensions, e.g., a 40 millimeter width by 40 millimeter length square profile.

Semiconductor die 104 and second semiconductor die 113 may be mounted on package substrate 106 within the profile of heat spreader joint 402. That is, heat spreader joint 402 may extend around the dies 104, 113. Each of the dies can include respective outward perimeters facing an inner surface of heat spreader joint 402. For example, semiconductor die 104 may include a lateral perimeter 404 having a rectangular profile, and second semiconductor die 113 may have an outward perimeter having a square profile.

In an embodiment, sealant bridge 214 is a sealant bead 403 extending laterally around a portion of lateral perimeter 404. For example, in FIG. 4, sealant bridge 214 may extend along a portion of a leftward side of semiconductor die 104. Sealant bridge 214 can be separated from heat spreader joint 402 by an outer distance 406. Outer distance 406 may be between sidewall 126 of integrated heat spreader 120 and an outward facing surface of sealant bridge 214. Similarly, an inward facing surface of sealant bridge 214 may be separated from the leftward side of semiconductor die 104 by an inner distance 408. Outer distance 406 plus inner distance 408 may equal a width of overhang gap 212 (minus a thickness of sealant bridge 214). Outer distance 406 may be greater than inner distance 408. Accordingly, the sealant bead 403 may adhere integrated heat spreader 120 to package substrate 106 near semiconductor die 104. This joint may minimize overhang gap 212 by creating more attachment points between integrated heat spreader 120 and package substrate 106 around semiconductor die 104. In an embodiment, an overhang gap between sealant bridge 214 and semiconductor die 104, e.g., inner distance 408, may modulate TIM stress. That is, reducing inner distance 408 can reduce TIM stress. In an embodiment, inner distance 408 may be no more than 7 mm. Accordingly, mechanical stress in the TIM joints between semiconductor die 104 and integrated heat spreader 120 may be minimized.

Attachment points provided by sealant bridge 214 may also be between components of semiconductor package 102. For example, sealant bridge 214 may be laterally between semiconductor die 104 and second semiconductor die 113. The intervening sealant bridge 214 can limit an unsupported heat spreader surface between the dies, and thus, can reduce TIM stresses of semiconductor die 104 and second semiconductor die 113.

In an embodiment, sealant bridge 214 may extend along a portion of second semiconductor die 113. As shown in FIG. 4, sealant bridge 214 may extend along an entire upper side of second semiconductor die 113, and may extend along a portion of a rightward side of second semiconductor die 113. The breadth or length of sealant bridges 214 shown in FIG. 4 is provided by way of example, however, and sealant bridge 214 may have any bead length or width. For example, several sealant bridges 214 may be located at discrete locations along lateral perimeter 404, e.g., each sealant bridge 214 may appear as a circular dot in the top view (not shown).

At any location along the sealant bead 403, sealant bridge 214 may have any of the cross-sectional profiles shown in FIGS. 3A-3C. more particularly, a cross-section taken through sealant bridge 214 at any location along the sealant bead 403 may have a sealant column profile (FIG. 3A), a sealant column on a non-encapsulated and/or exposed DSC 216 (FIG. 3B), or a sealant column encapsulating DSC 216 (FIG. 3C).

Figure 5:
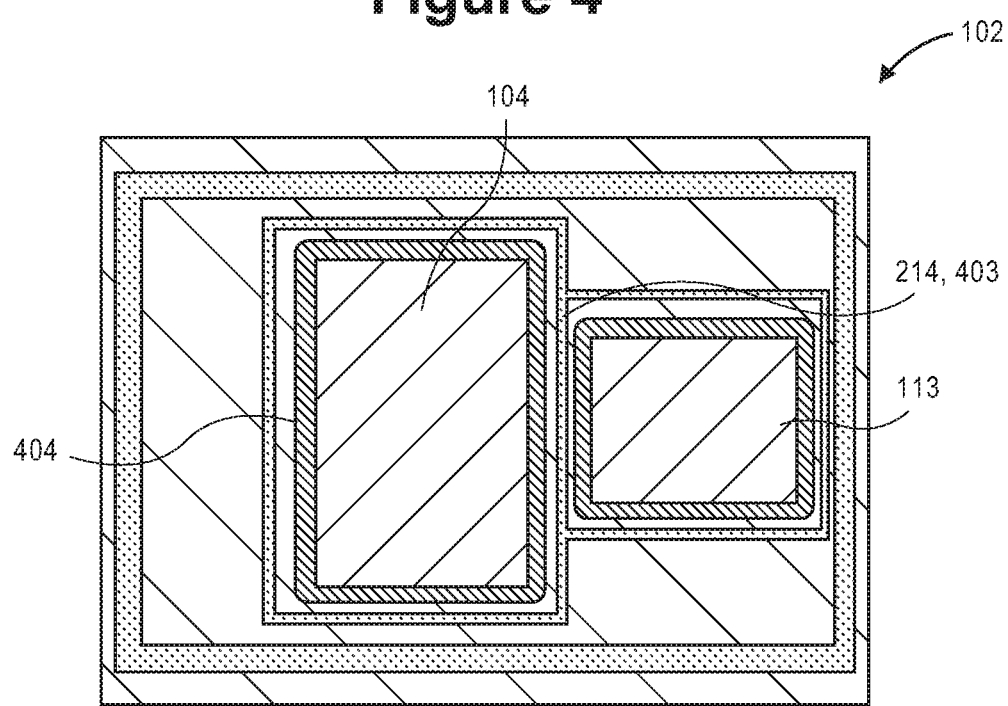
FIG. 5 illustrates a cross-sectional view of a sealant bridge extending around an entirety of a perimeter of a semiconductor die, in accordance with an embodiment.

Referring to FIG. 5, a cross-sectional view of a sealant bridge extending around an entirety of a perimeter of a semiconductor die is shown in accordance with an embodiment. Sealant bridge 214 may extend entirely around semiconductor die 104 and/or second semiconductor die 113. For example, sealant bridge 214 may be a continuous bead of sealant material extending laterally around the entirety of lateral perimeter 404. Sealant bead 403 may form a sealant dam conforming to lateral perimeter 404. For example, lateral perimeter 404 may be rectangular, and sealant bead 403 may have a rectangular path or profile. Furthermore, the respective sealant beads 403 extending around semiconductor die 104 and second semiconductor die 113 may converge. For example, a single sealant bead 403 may extend between the sides of dies 104, 113 that face each other.

Figure 6:
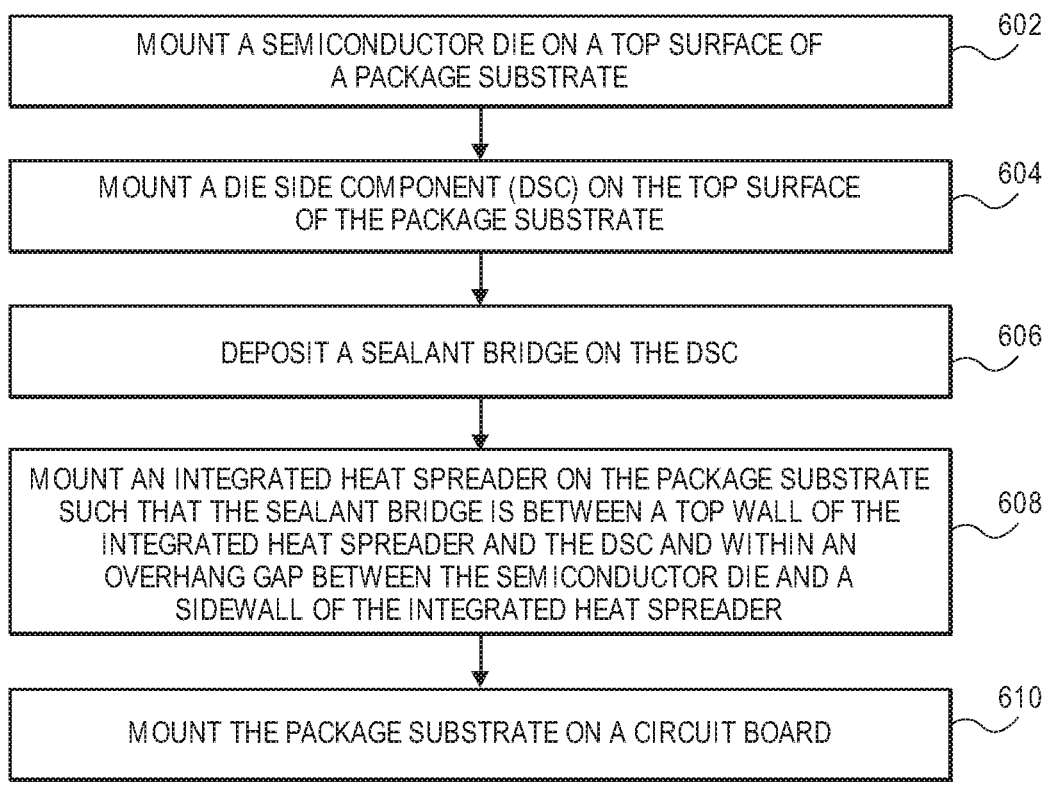
FIG. 6 illustrates a method of fabricating a semiconductor package assembly including a semiconductor package having a sealant bridge between an integrated heat spreader and a package substrate, in accordance with an embodiment.

Referring to FIG. 6, a method of fabricating a semiconductor package assembly including a semiconductor package having a sealant bridge between an integrated heat spreader and a package substrate is shown in accordance with an embodiment. At operation 602, semiconductor die 104 and/or second semiconductor die 113 is mounted on top surface 204 of package substrate 106. Semiconductor die 104 may be mounted using a chip attach module or another chip attachment process. By way of example, semiconductor die 104 may be soldered or glued onto package substrate 106.

At operation 604, DSC 216 is mounted on top surface 204 of package substrate 106. DSC 216 may be attached to package substrate 106 using a same or different attachment process as the process used at operation 602. For example, DSC 216 may be soldered or glued onto package substrate 106. Attachment of semiconductor die 104, second semiconductor die 113, or DSC 216 can be followed by a deflux process to remove any contaminants, such as oxides. An underfill process may then be used to underfill semiconductor die 104, second semiconductor die 113, or DSC 216 with an epoxy material to provide mechanical support to the components. A high temperature cure process may be used to cure the underfill material and securely bond the components to package substrate 106.

At operation 606, sealant bridge 214 is deposited. For example, sealant bridge 214 may be deposited directly on top surface 204 of package substrate 106 to form a columnar structure (FIG. 3A). Sealant bridge 214 may also be deposited on DSC 216 (FIGS. 3B-3C). Accordingly, in some regions sealant bridge 214 is only sealant, and in other regions sealant bridge 214 includes a functional or a dummy component, e.g., a capacitor. The sealant material may be dispensed over top surface 204 as sealant bead 403 extending laterally around semiconductor dies 104, 113. That is, sealant bridge 214 may be deposited to form sealant bead 403 laterally around semiconductor dies 104 and/or second semiconductor die 113. The sealant material may be deposited using a variety of sealant dispensing processes. For example, sealant may be dispensed by a valve dispense process that applies sealant bridge 214 using a syringe-type mechanism. Similarly, sealant may be dispensed by a jet dispensing process that applies sealant bridge 214 using a spray-type mechanism.

At operation 608, integrated heat spreader 120 is mounted on package substrate 106 such that sealant bridge 214 is between top wall 122 and DSC 216. Sealant bridge 214 can be within overhang gap 212 between semiconductor die 104 and sidewall 126 of integrated heat spreader 120. Attachment of integrated heat spreader 120 to package substrate 106 can be performed by a direct lid attach process. The direct lid attach process can apply sealant between sidewall 126 of integrated heat spreader 120 and package substrate 106. Furthermore, the direct lid attach process can apply TIM material between top wall 122 and semiconductor die 104. When integrated heat spreader 120 is mounted on package substrate 106, top wall 122 can contact sealant bridge 214 to fill a vertical gap between top wall 122 and package substrate 106 with the sealant material.

At operation 610, semiconductor package 102 is mounted on circuit board 114. For example, package substrate 106 can be mounted on or attached to circuit board 114. Mounting semiconductor package 102 on circuit board 114 may include soldering solder balls 116 on package substrate 106 to corresponding contact pads on circuit board 114. Accordingly, a semiconductor package assembly 100 may be formed having integrated heat spreader 120 attached to package substrate 106 by sealant bridges 214. It will be appreciated that the method described above may utilize existing manufacturing processes to fabricate semiconductor package assembly 100. Accordingly, semiconductor package assembly 100 may be fabricated without disrupting an existing package process design, which can minimize product manufacturing costs.

Normalized stress in thermal interface material of various semiconductor package designs has been evaluated. The results indicate that a reduction in TIM stress of up to 20% is realized in semiconductor package designs incorporating sealant bridges 214 around all or part of the semiconductor dies 104. For example, TIM stress in TIM layer 206 over semiconductor die 104 can be 20% lower, on average, for the semiconductor package 102 shown in FIG. 5 as compared to a similar semiconductor package design not having sealant bridges 214 around semiconductor die 104 and second semiconductor die 113. The lowered TIM stress can significantly improve thermal performance of the TIM layer 206 over time, as described below.

Figure 7:
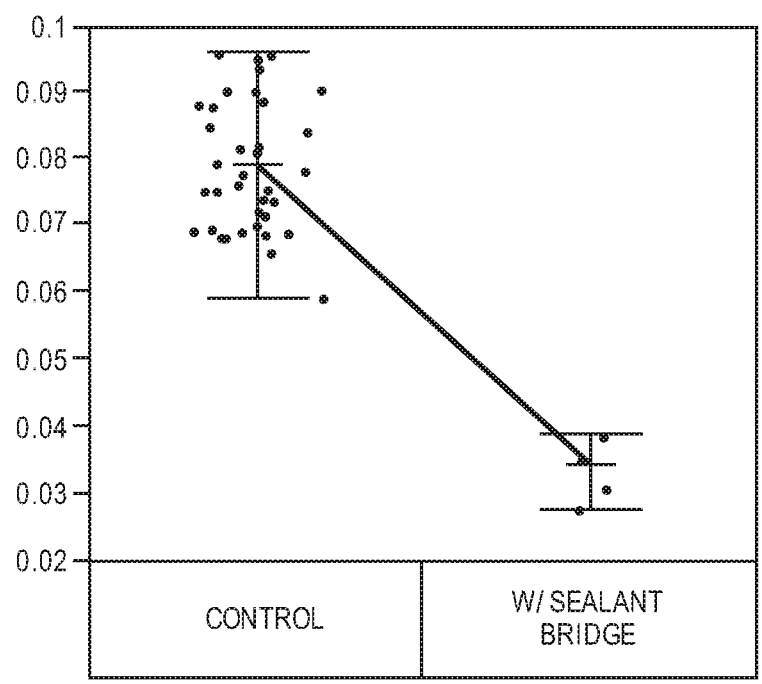
FIG. 7 illustrates a graph of beginning-of-life thermal resistance of die-to-spreader junctions of various semiconductor package designs, in accordance with an embodiment.

Referring to FIG. 7, a graph of beginning-of-life thermal resistance of die-to-spreader junctions of various semiconductor package designs is shown in accordance with an embodiment. A control unit, i.e., a semiconductor package 102 without sealant bridges 214, is compared to semiconductor package 102 having sealant bridges 214 (FIG. 5) to assess a benefit in thermal resistance at a junction between integrated heat spreader 120 and semiconductor die 104. The thermal resistance corresponds to a thermal resistance of the TIM layer 206. The graph essentially represents how much heat is dissipated from semiconductor die 104 by the TIM layer 206. The control data set is significantly higher, on average, than the data set representing semiconductor package 102 having sealant bridges 214. More particularly, the lower values for the semiconductor package 102 having sealant bridges 214 shows that temperature resistance is lower, and thus, heat dissipation in the TIM layer 206 is higher at a beginning-of-life of semiconductor package 102.

Figure 8:
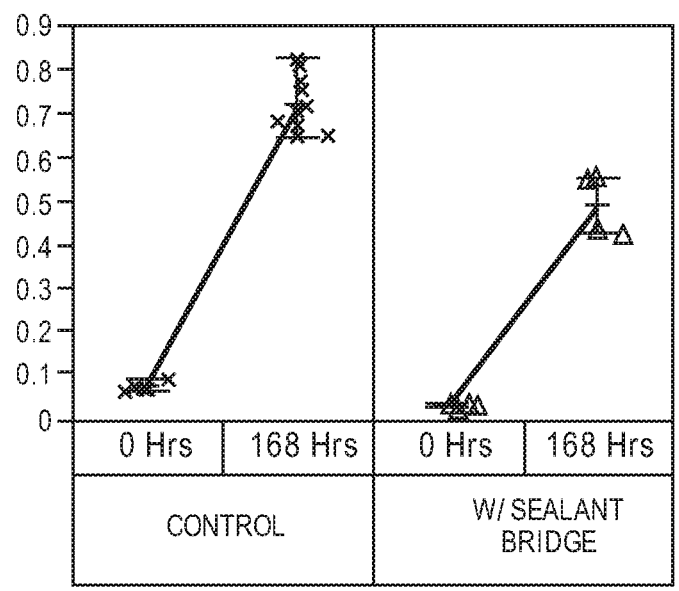
FIG. 8 illustrates a graph of lifespan changes of thermal resistance of die-to-spreader junctions of various semiconductor package designs, in accordance with an embodiment.

Referring to FIG. 8, a graph of lifespan changes of thermal resistance of die-to-spreader junctions of various semiconductor package designs is shown in accordance with an embodiment. The graph essentially represents a change in thermal resistance over time, e.g., from an initial time to a time 168 hours later. The 168 hour timeframe may represent a lifespan of the semiconductor package product. Furthermore, the graphed data is for reliability testing using accelerated bake conditions for 168 hours, which represents the life span of the product. The accelerated bake test mimics the lifespan of the product, and actual aging data may be similar. Not only is thermal resistance lower in semiconductor package 102 having sealant bridges 214 at the initial time (the beginning-of-life), but the increase in thermal resistance over time is greater for the control unit. Thus, sealant bridges 214 substantially mitigate thermal degradation of TIM layers 206.

As noted above, in addition to degradation caused by excessive overhang induced by dynamic warpage, TIM layer 206 failures can also result from variations in package tolerances of TIM thicknesses and excessive loading of TIM layers 206 on satellite chips mounted on a "diving board" portion of package substrate 106. This failure mode, and solutions to the failure mode, are described further below.

Figure 9:
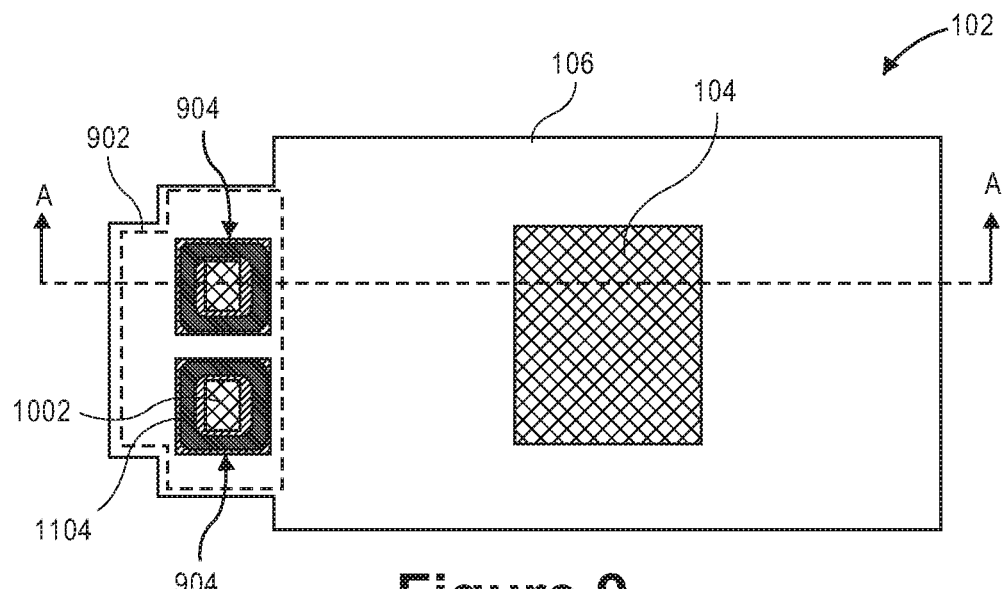
FIG. 9 illustrates a cross-sectional view of a semiconductor package having a sealant bridge between an integrated heat spreader and a satellite chip mounted on a package substrate, in accordance with an embodiment.

FIG. 9 illustrates a cross-sectional view of a semiconductor package having a sealant bridge between an integrated heat spreader and a satellite chip mounted on a package substrate, in accordance with an embodiment. Package substrate 106 may not have a rectangular profile. That is, package substrate 106 may be irregularly-shaped and have one or more portions that project outward from other portions. In an embodiment, a region of package substrate 106 projecting leftward from a main region of package substrate 106 may be referred to as a diving board 902. Diving board 902 is illustrated as the region of package substrate 106 within the dotted line in FIG. 9. Diving board 902 may be cantilevered from the main region. That is, the main region supporting semiconductor die 104, which may be a CPU die, may be supported on an underlying circuit board 114 (not shown). By contrast, diving board 902 may not be supported by circuit board 114. Accordingly, when a vertical load is applied to the main region, the main region may remain stable, but when the vertical load is applied to diving board 902, the diving board region may deflect downward.

Figure 10:
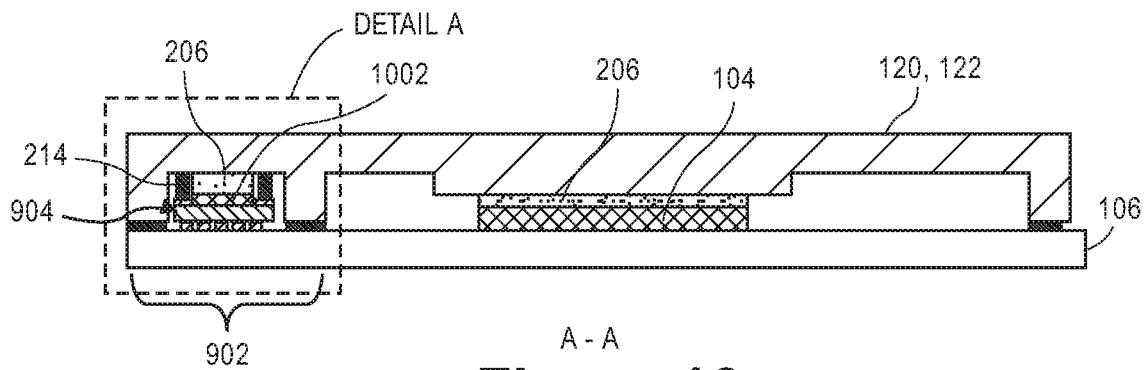
FIG. 10 illustrates a cross-sectional view, taken about line A-A of FIG. 9, of a semiconductor package having a sealant bridge between an integrated heat spreader and a satellite chip mounted on a package substrate, in accordance with an embodiment.

Semiconductor package 102 having package substrate 106 that includes diving board 902 may be a MCP, and one or more satellite chips 904 may be mounted on package substrate 106 around semiconductor die 104. More particularly, satellite chips 904 may be mounted within overhang gap 212 between semiconductor die 104 and sidewall 126 of integrated heat spreader 120 (FIG. 10). In an embodiment, satellite chip(s) 904 are mounted on diving board 902 of package substrate 106. Satellite chip 904 may be referred to as a "fabric chip" or a "neighboring chip," and may be a non-CPU chip that adds functionality to the main processing chip, e.g., semiconductor die 104. Two satellite chips 904 are shown on diving board 902 in FIG. 9, however, it will be appreciated that more chip packages, e.g., four or more, may be mounted on diving board 902.

FIG. 10 illustrates a cross-sectional view, taken about line A-A of FIG. 9, of a semiconductor package having a sealant bridge between an integrated heat spreader and a satellite chip mounted on a package substrate 106, in accordance with an embodiment. Satellite chip 904 may be mounted on diving board 902 in an exposed die mold package, and integrated heat spreader 120 may be mounted over satellite chip 904. Accordingly, satellite chip 904 may be between integrated heat spreader 120 and package substrate 106. A TIM layer 206 may be disposed between integrated heat spreader 120 and a satellite die 1002 of satellite chip 904. Similarly, a TIM layer 206 may be disposed between integrated heat spreader 120 and semiconductor die 104. A thickness of satellite die 1002 may have a wide tolerance, e.g., +/-150 microns, because satellite chips 904 may be manufactured in a less controlled manufacturing process than semiconductor die 104. As a result, a thickness of TIM layer 206 over satellite die 1002 may increase to accommodate variations in the gap between satellite die 1002 and top wall 122 of integrated heat spreader 120. TIM layer 206 thickness over satellite die 1002 may be greater than a thickness of TIM layer 206 over semiconductor die 104. The thick TIM layer 206 over satellite die 1002 may be sensitive to loading, and in particular, deflection of diving board 902 under vertical loads may exacerbate loading of the thick TIM layer 206. Without structural support, the thick TIM layer 206 may displace under cyclic thermal and mechanical loading. More particularly, large variation in TIM layer thickness and diving board 902 deflection can cause TIM material to "pump out," which means that TIM material can move from one location to another. When TIM material moves, the thermal joint between integrated heat spreader 120 and satellite die 1002 may degrade, causing an increase in thermal resistance over time.

In an embodiment, sealant bridge 214 extends between top wall 122 of integrated heat spreader 120 and satellite chip 904. Sealant bridge 214 can stabilize satellite chip 904 by resisting deflection of diving board 902. For example, a likelihood of downward deflection of diving board 902 may be reduced because sealant bridge 214 can provide a reactive load to satellite chip 904 attached to diving board 902. Furthermore, sealant bridge 214 may be laterally beside TIM layer 206 of satellite chip 904, and thus, warpage of integrated heat spreader 120 above satellite die 1002 may be reduced by providing additional attachment points around TIM layer 206, similar to the effect described above with respect to FIG. 2. In short, sealant bridge 214 between top wall 122 and satellite chip 904 can reduce a likelihood of TIM failure.

Figure 11:
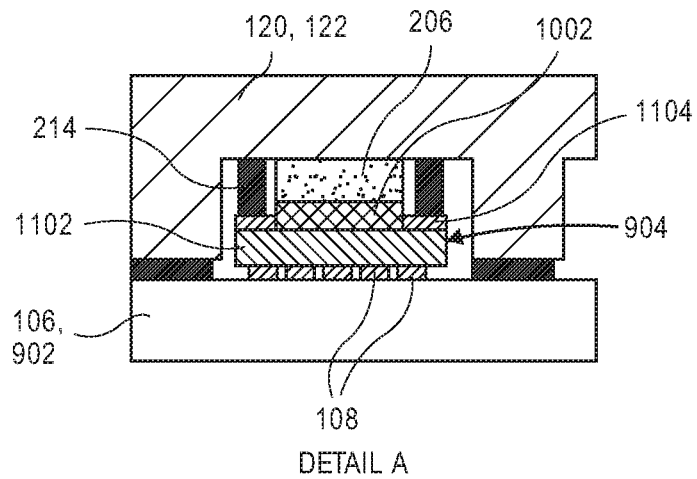
FIG. 11 illustrates a detail view, taken from Detail A of FIG. 10, of a semiconductor package having a sealant bridge between an integrated heat spreader and a satellite chip mounted on a package substrate, in accordance with an embodiment.

FIG. 11 illustrates a detail view, taken from Detail A of FIG. 10, of a semiconductor package having a sealant bridge between an integrated heat spreader and a satellite chip mounted on a package substrate, in accordance with an embodiment. Satellite chip 904 on diving board 902 can include satellite die 1002 mounted on a patch substrate 1102. Patch substrate 1102 may be a laminate substrate having one or more dielectric layers. Patch substrate 1102 may be mounted on package substrate 106, e.g., on diving board 902, by one or more electrical interconnects 108, and electrical interconnect(s) 108 may electrically connect circuitry on package substrate 106 to satellite die 1002.

In an embodiment, a mold layer 1104 may be disposed on an upper surface of patch substrate 1102. Mold layer 1104 may be fabricated from a mold material dispensed onto the upper surface. For example, the mold material may be a mixture of ceramic, metallic, or epoxy constituent materials that are dispensed onto patch substrate 1102 around satellite die 1002. Mold layer 1104 may be stiffer than patch substrate 1102. Mold layer 1104 may extend laterally around satellite die 1002. Accordingly, mold layer 1104 may provide a stiffening effect to satellite chip 904 mounted on diving board 902.

Prior to attaching integrated heat spreader 120 to satellite die 1002 by TIM layer 206, mold layer 1104 can surround side surfaces of satellite die 1002, and the upper surface of satellite die 1002 may be exposed (FIG. 9). Mold layer 1104 may provide a structure to locally anchor satellite chip 904 to integrated heat spreader 120. For example, sealant bridge 214 can extend from top wall 122 of integrated heat spreader 120 to mold layer 1104. Sealant bridge 214 may be an adhesive material on top of the mold surface to anchor integrated heat spreader 120 to satellite chip 904 and diving board 902. In an embodiment, sealant bridge 214 extends around TIM layer 206. For example, sealant bridge 214 may have an annular cross-section surrounding TIM layer 206. A lateral gap may separate a laterally inward surface of sealant bridge 214 from TIM layer 206.

Sealant bridge 214 can reduce a deflection of diving board 902 during loading. As discussed above, sealant bridge 214 may be fabricated from a high modulus sealant, and thus, sealant bridge 214 can reduce strain within a region of integrated heat spreader 120 over satellite chip 904. The reduced strain can result in lower stress within TIM layer 206 when diving board 902 is mechanically loaded.

FIGS. 12A-12C illustrate cross-sectional views of a stiffener of a satellite chip mounted on a package substrate, in accordance with an embodiment. The stiffening effect provided by sealant bridge 214 may be enhanced by incorporating one or more stiffeners 1202 on satellite chip 904.

Satellite chip 904 may include a stiffener 1202 mounted on patch substrate 1102. Stiffener 1202 may be a prefabricated element having a predetermined shape and modulus. More particularly, the modulus of stiffener 1202 may be higher than a modulus of sealant bridge 214. Accordingly, stiffener 1202 may increase a stiffness of the joint between integrated heat spreader 120 and satellite chip 904.

Referring to FIG. 12A, stiffener 1202 may be an elongated strip of material, e.g., a metal strip. The elongated stiffener 1202 may bridge between a first satellite chip 904 and a second satellite chip 904 on diving board 902. More particularly, stiffener 1202 may laterally connect the first satellite chip 904 to the second satellite chip 904. The elongated stiffener 1202 can include a first portion mounted on mold layer 1104 of the first satellite chip 904, and a second portion mounted on mold layer 1104 of the second satellite chip 904. Semiconductor package 102 may include several stiffeners 1202. For example, a first stiffener 1202 strip may connect first satellite chip 904 to second satellite chip 904 on a first side, e.g., a leftward side, of satellite dies 1002, and a second stiffener 1202 strip may connect the satellite chips 904 on a second side, e.g., a rightward side, of satellite dies 1002. Accordingly, the several stiffeners 1202 may be discontinuous.

Referring to FIG. 12B, semiconductor package 102 may include a monolithic stiffener 1202 connecting satellite chips 904 on both sides of satellite dies 1002. In an embodiment, stiffener 1202 includes a rightward strip 1204 and a leftward strip 1206. Rightward strip 1204 may be connected to leftward strip 1206 by a central strip 1208 extending orthogonally between rightward strip 1204 and leftward strip 1206. The central strip may be between satellite dies 1002. The monolithic shape of stiffener 1202 may therefore be I-shaped. The I-shaped stiffener 1202 can connect adjacent satellite chips 904 mounted on diving board 902. The orthogonally oriented sections of stiffener 1202 can resist lateral deflections in different directions, and thus, can reduce TIM stress.

Referring to FIG. 12C, semiconductor package 102 may include a continuous stiffener 1202 connecting satellite chips 904 around satellite dies 1002. In an embodiment, stiffener 1202 is an annular stiffener 1202 having a rectangular path. Stiffener 1202 may be mounted on mold layer 1104 of a first satellite chip 904 and an adjacent satellite chip 904, and satellite dies 1002 may be located in a central gap within the annular stiffener 1202. The sides of the rectangular stiffener 1202 can resist lateral deflections in different directions, and thus, can reduce TIM stress.

FIG. 13 illustrates a cross-sectional view, taken about line A-A of FIG. 9, of a semiconductor package having a sealant bridge between an integrated heat spreader and a stiffener of a satellite chip mounted on a package substrate, in accordance with an embodiment. Integrated heat spreader 120 may be mounted over satellite chips 904. Accordingly, satellite chips 904 may be between integrated heat spreader 120 and package substrate 106. A TIM layer 206 may be disposed between integrated heat spreader 120 and a satellite die 1002 of satellite chip 904. Similarly, a TIM layer 206 may be disposed between integrated heat spreader 120 and semiconductor die 104. In an embodiment, sealant bridge 214 extends between top wall 122 of integrated heat spreader 120 and stiffener(s) 1202. Sealant bridge 214 can stabilize satellite chip 904 by resisting deflection of diving board 902. As discussed above, sealant bridge 214 may be laterally beside TIM layer 206 over satellite die 1002, and sealant bridge 214 between top wall 122 and satellite chip 904 can reduce a likelihood of TIM failure.

FIG. 14 illustrates a detail view, taken from Detail B of FIG. 13, of a semiconductor package having a sealant bridge between an integrated heat spreader and a stiffener of a satellite chip mounted on a package substrate, in accordance with an embodiment. Satellite chip 904 on diving board 902 can include satellite die 1002 mounted on a patch substrate 1102. Patch substrate 1102 may be mounted on package substrate 106 by one or more electrical interconnects 108, and electrical interconnect(s) 108 may electrically connect circuitry on package substrate 106 to satellite die 1002.

Mold layer 1104 may be disposed on an upper surface of patch substrate 1102. Prior to attaching integrated heat spreader 120 to satellite die 1002 by TIM layer 206, mold layer 1104 can surround side surfaces of satellite die 1002, and the upper surface of satellite die 1002 may be exposed (FIGS. 12A-12C).

In an embodiment, an intermediate adhesive layer 1402 is disposed on an upper surface of mold layer 1104. More particularly, intermediate adhesive layer 1402 may be between mold layer 1104 and stiffener 1202. Intermediate adhesive layer 1402 may be fabricated from an epoxy material. Accordingly, intermediate adhesive layer 1402 may bond stiffener 1202 to an underlying mold layer 1104.

Stiffener 1202 may be mounted on intermediate adhesive layer 1402 over mold layer 1104. As described above with respect to FIGS. 12A-12C, stiffener 1202 may be discontinuous or continuous, and may laterally connect two or more satellite chips 904. In an embodiment, stiffener 1202 is mounted on a single satellite chip 904. That is, stiffener 1202 may not interconnect adjacent satellite chips 904.

Stiffener 1202 may provide a structure to locally anchor satellite chip 904 to integrated heat spreader 120. For example, sealant bridge 214 can extend from top wall 122 of integrated heat spreader 120 to stiffener 1202. Sealant bridge 214 may be an adhesive material on top of stiffener 1202 to anchor integrated heat spreader 120 to satellite chip 904 and diving board 902. In an embodiment, sealant bridge 214 extends around TIM layer 206. For example, sealant bridge 214 may have an annular cross-section surrounding TIM layer 206. A lateral gap may separate a laterally inward surface of sealant bridge 214 from TIM layer 206 as described above.

Failure analysis of semiconductor packages 102 having the architecture described above with respect to FIGS. 9-14 has shown that local anchoring of satellite chips 904 reduces a sensitivity of satellite chips 904 to mechanical loading. That is, when high loading is applied to semiconductor package 102, TIM layer 206 over satellite chips 904 experiences less strain and stress when satellite chips 904 are anchored to integrated heat spreader 120. TIM pump out is therefore mitigated by sealant bridge 214 between integrated heat spreader 120 and satellite chips 904, and thermal performance is improved at a beginning-of-life and during a life cycle of semiconductor package 102.

The semiconductor package 102 architectures described above with respect to FIGS. 9-14 may be fabricated using manufacturing tools and processes similar to those described above with respect to FIG. 6. A method of fabricating a semiconductor package assembly 100 including a semiconductor package 102 having a sealant bridge 214 between an integrated heat spreader 120 and a satellite chip 904 can include several operations. At an operation, semiconductor die 104 and one or more satellite chips 904 are mounted on top surface 204 of package substrate 106. Semiconductor die 104 may be mounted on the main region of package substrate 106, and satellite chip(s) 904 may be mounted on diving board 902. The components may be mounted using a chip attach module or another chip attachment process. In an embodiment, satellite chips 904 may be exposed die mold packages having satellite dies 1002 exposed during placement. By way of example, semiconductor die 104 and/or satellite chips 904 may be soldered, glued, or reflowed onto package substrate 106.

At an operation, an underfill process may be used to underfill semiconductor die 104 and/or satellite chips 904 to provide mechanical support to the components. A high temperature cure process may be used to cure the underfill material and securely bond the components to package substrate 106.

At an operation, stiffener 1202 may be optionally mounted on satellite chip 904. For example, intermediate adhesive layer 1402 may be dispensed onto mold layer 1104, and stiffener 1202 may be picked and placed onto intermediate adhesive layer 1402. Optionally, the adhesive bonds, including intermediate adhesive layer 1402, may be cured. For example, thermal gang bonding may be used to simultaneously cure the bonds between: semiconductor die 104 and package substrate 106; satellite chip 904 and package substrate 106; and stiffener 1202 and satellite chip 904. A thermal gang bonder may press and heat the components to cure the previously dispensed adhesive bonds.

At an operation, sealant bridge 214 is deposited. For example, sealant bridge 214 may be dispensed on mold layer 1104, or in the case when satellite chip 904 includes stiffener 1202, sealant bridge 214 may be dispensed on stiffener 1202. Sealant bridge 214 may be deposited to form sealant bead 403 laterally around satellite dies 1002. Alternatively, sealant bridge 214 may be deposited as localized dots or columns of material, which are viscous and will flow around satellite dies 1002 when pressed by integrated heat spreader 120. The sealant material may be deposited using a variety of sealant dispensing processes. For example, sealant may be dispensed by a valve dispense process that applies sealant bridge 214 using a syringe-type mechanism. Similarly, sealant may be dispensed by a jet dispensing process that applies sealant bridge 214 using a spray-type mechanism.

At an operation, TIM material may be dispensed on semiconductor die 104 and satellite dies 1002. For example, TIM layer 206 may be applied to satellite chip 904 within a perimeter formed by sealant bridge 214 material.

At an operation, integrated heat spreader 120 is mounted on package substrate 106. Integrated heat spreader 120 may press on TIM layers 206 over semiconductor die 104 and satellite die 1002, as well as sealant bridges 214. Accordingly, sealant bridges 214 may spread around satellite dies 1002 between top wall 122 and stiffener 1202 and/or mold layer 1104 of satellite chip 904. Sealant bridge 214 can be within overhang gap 212 between semiconductor die 104 and sidewall 126 of integrated heat spreader 120.

Attachment of integrated heat spreader 120 to package substrate 106 can be performed by a direct lid attach process. The direct lid attach process can apply sealant between sidewall 126 of integrated heat spreader 120 and package substrate 106. After placing integrated heat spreader 120 on package substrate 106 a thermal gang bonder may be used to cure any remaining uncured adhesive joints, and thus, to complete the fabrication of semiconductor package 102. At an operation, semiconductor package 102 can be mounted on circuit board 114.

Figure 15:
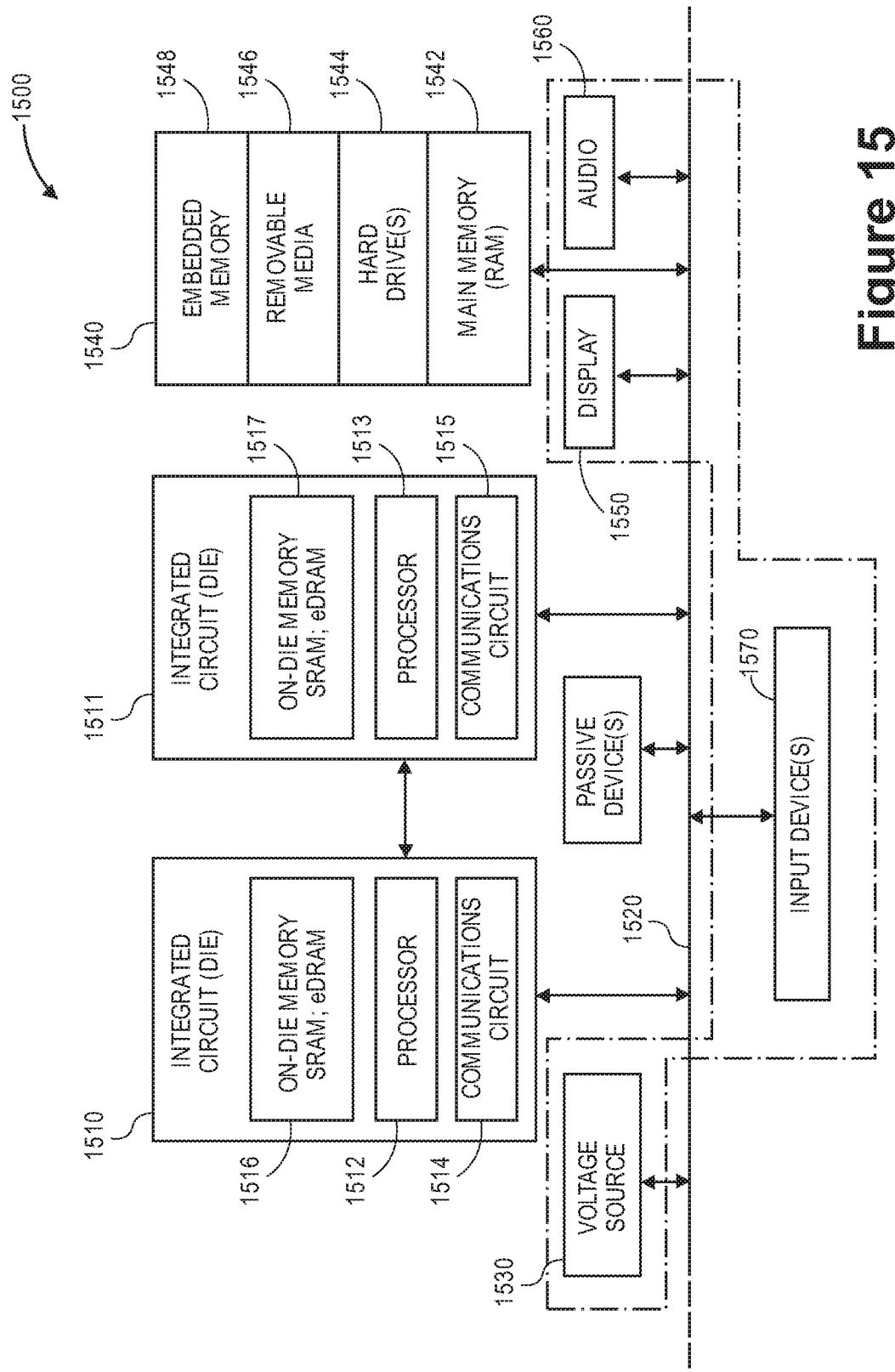
FIG. 15 is a schematic of a computer system, in accordance with an embodiment.

FIG. 15 is a schematic of a computer system shown in accordance with an embodiment. The computer system 1500 (also referred to as the electronic system 1500) as depicted can embody a semiconductor package having a sealant bridge between an integrated heat spreader and a package substrate as described according to any of the several disclosed embodiments and their equivalents as set forth in this disclosure. The computer system 1500 may be a mobile device such as a netbook computer. The computer system 1500 may be a mobile device such as a wireless smart phone. The computer system 1500 may be a desktop computer. The computer system 1500 may be a hand-held reader. The computer system 1500 may be a server system. The computer system 1500 may be a supercomputer or high-performance computing system.

In an embodiment, the electronic system 1500 is a computer system that includes a system bus 1520 to electrically couple the various components of the electronic system 1500. The system bus 1520 is a single bus or any combination of busses according to various embodiments. The electronic system 1500 includes a voltage source 1530 that provides power to the integrated circuit 1510. In some embodiments, the voltage source 1530 supplies current to the integrated circuit 1510 through the system bus 1520.

The integrated circuit 1510 is electrically coupled to the system bus 1520 and includes any circuit, or combination of circuits according to an embodiment. In an embodiment, the integrated circuit 1510 includes a processor 1512 that can be of any type. As used herein, the processor 1512 may mean any type of circuit such as, but not limited to, a microprocessor, a microcontroller, a graphics processor, a digital signal processor, or another processor. In an embodiment, the processor 1512 includes, or is coupled with, a semiconductor package having a sealant bridge between an integrated heat spreader and a package substrate, as disclosed herein. In an embodiment, SRAM embodiments are found in memory caches of the processor. Other types of circuits that can be included in the integrated circuit 1510 are a custom circuit or an application-specific integrated circuit (ASIC), such as a communications circuit 1514 for use in wireless devices such as cellular telephones, smart phones, pagers, portable computers, two-way radios, and similar electronic systems, or a communications circuit for servers. In an embodiment, the integrated circuit 1510 includes on-die memory 1516 such as static random-access memory (SRAM). In an embodiment, the integrated circuit 1510 includes embedded on-die memory 1516 such as embedded dynamic random-access memory (eDRAM).

In an embodiment, the integrated circuit 1510 is complemented with a subsequent integrated circuit 1511. Useful embodiments include a dual processor 1513 and a dual communications circuit 1515 and dual on-die memory 1517 such as SRAM. In an embodiment, the dual integrated circuit 1511 includes embedded on-die memory 1517 such as eDRAM.

In an embodiment, the electronic system 1500 also includes an external memory 1540 that in turn may include one or more memory elements suitable to the particular application, such as a main memory 1542 in the form of RAM, one or more hard drives 1544, and/or one or more drives that handle removable media 1546, such as diskettes, compact disks (CDs), digital variable disks (DVDs), flash memory drives, and other removable media known in the art. The external memory 1540 may also be embedded memory 1548 such as the first die in a die stack, according to an embodiment.

In an embodiment, the electronic system 1500 also includes a display device 1550, and an audio output 1560. In an embodiment, the electronic system 1500 includes an input device such as a controller 1570 that may be a keyboard, mouse, trackball, game controller, microphone, voice-recognition device, or any other input device that inputs information into the electronic system 1500. In an embodiment, an input device 1570 is a camera. In an embodiment, an input device 1570 is a digital sound recorder. In an embodiment, an input device 1570 is a camera and a digital sound recorder.

As shown herein, the integrated circuit 1510 can be implemented in a number of different embodiments, including a semiconductor package having a sealant bridge between an integrated heat spreader and a package substrate, according to any of the several disclosed embodiments and their equivalents, an electronic system, a computer system, one or more methods of fabricating an integrated circuit, and one or more methods of fabricating an electronic assembly that includes a semiconductor package having a sealant bridge between an integrated heat spreader and a package substrate, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor packages having a sealant bridge between an integrated heat spreader and a package substrate embodiments and their equivalents. A foundation substrate may be included, as represented by the dashed line of FIG. 15. Passive devices may also be included, as is also depicted in FIG. 15.

Embodiments of semiconductor packages having a sealant bridge between an integrated heat spreader and a package substrate are described above. In an embodiment, a semiconductor package includes a package substrate including a top surface. The semiconductor package includes a semiconductor die mounted on the package substrate. The semiconductor package includes an integrated heat spreader mounted on the package substrate. The integrated heat spreader includes a top wall over the semiconductor die and a sidewall between the top wall and the top surface. The semiconductor die is separated from the sidewall by an overhang gap. The semiconductor package includes a sealant bridge within the overhang gap between the top wall and the top surface.

In one embodiment, the semiconductor package includes a die side component (DSC) mounted on the package substrate within the overhang gap. The sealant bridge extends between the top wall and the DSC.

In one embodiment, the DSC is a functional electronic component.

In one embodiment, the functional electronic component is a capacitor.

In one embodiment, the DSC is a non-functional component.

In one embodiment, the DSC is encapsulated between the sealant bridge and the top surface.

In one embodiment, the semiconductor die includes a lateral perimeter. The sealant bridge extends laterally around a portion of the lateral perimeter.

In one embodiment, the sealant bridge extends laterally around an entirety of the lateral perimeter.

In one embodiment, the semiconductor package includes a satellite chip mounted on the package substrate within the overhang gap. The sealant bridge extends between the top wall and the satellite chip.

In one embodiment, the satellite chip includes a stiffener mounted on a patch substrate. The sealant bridge extends between the top wall and the stiffener.

In an embodiment, a semiconductor package assembly includes a printed circuit board. The semiconductor package assembly includes a semiconductor package mounted on the printed circuit board. The semiconductor package includes a package substrate including a top surface. The semiconductor package includes a semiconductor die mounted on the package substrate. The semiconductor package includes an integrated heat spreader mounted on the package substrate. The integrated heat spreader includes a top wall over the semiconductor die and a sidewall between the top wall and the top surface. The semiconductor die is separated from the sidewall by an overhang gap. The semiconductor package includes a sealant bridge within the overhang gap between the top wall and the top surface.

In one embodiment, the semiconductor package assembly includes a die side component (DSC) mounted on the package substrate within the overhang gap. The sealant bridge extends between the top wall and the DSC.

In one embodiment, the DSC is a functional electronic component.

In one embodiment, the DSC is a non-functional component.

In one embodiment, the semiconductor package assembly includes a satellite chip mounted on the package substrate within the overhang gap. The sealant bridge extends between the top wall and the satellite chip.

In an embodiment, a method of fabricating a semiconductor package assembly including a semiconductor package having a sealant bridge between an integrated heat spreader and a package substrate includes mounting a semiconductor die on a package substrate. The package substrate includes a top surface. The method includes depositing a sealant bridge over the top surface. The method includes mounting an integrated heat spreader on the package substrate. The integrated heat spreader includes a top wall over the semiconductor die and a sidewall between the top wall and the top surface. The sealant bridge is within an overhang gap between the semiconductor die and the sidewall, and between the top wall and the top surface.

In one embodiment, the method includes mounting a die side component (DSC) on the top surface of the package substrate. The sealant bridge extends between the top wall and the DSC.

In one embodiment, the DSC is a functional electronic component.

In one embodiment, depositing the sealant bridge includes forming a sealant bead laterally around the semiconductor die.

In one embodiment, the method includes mounting a satellite chip on the top surface of the package substrate. The sealant bridge extends between the top wall and the satellite chip.

The invention claimed is:

1. A semiconductor package, comprising:
a package substrate including a top surface;
a semiconductor die mounted directly on the package substrate;
an integrated heat spreader mounted on the package substrate, wherein the integrated heat spreader includes a top wall over the semiconductor die and a sidewall between the top wall and the top surface, and wherein the semiconductor die is separated from the sidewall by an overhang gap;
a sealant bridge within the overhang gap between the top wall and the top surface; and
a die side component (DSC) mounted directly on the package substrate within the overhang gap, wherein the sealant bridge is on the DSC and extends between the top wall and the DSC, and wherein the sealant bridge is further on at least a portion of a vertical sidewall of the DSC.

2. The semiconductor package of claim 1, wherein the DSC is a functional electronic component.

3. The semiconductor package of claim 2, wherein the functional electronic component is a capacitor.

4. The semiconductor package of claim 1, wherein the DSC is a non-functional component.

5. The semiconductor package of claim 1, wherein the DSC is encapsulated between the sealant bridge and the top surface.

6. The semiconductor package of claim 1, wherein the semiconductor die includes a lateral perimeter, and wherein the sealant bridge extends laterally around a portion of the lateral perimeter.

7. The semiconductor package of claim 6, wherein the sealant bridge extends laterally around an entirety of the lateral perimeter.

8. The semiconductor package of claim 1 further comprising a satellite chip mounted on the package substrate within the overhang gap, wherein the sealant bridge extends between the top wall and the satellite chip.

9. The semiconductor package of claim 8, wherein the satellite chip includes a stiffener mounted on a patch substrate, and wherein the sealant bridge extends between the top wall and the stiffener.

10. A semiconductor package assembly, comprising:
a printed circuit board; and
a semiconductor package mounted on the printed circuit board, the semiconductor package including a package substrate including a top surface, a semiconductor die mounted directly on the package substrate, an integrated heat spreader mounted on the package substrate, wherein the integrated heat spreader includes a top wall over the semiconductor die and a sidewall between the top wall and the top surface, and wherein the semiconductor die is separated from the sidewall by an overhang gap, and a sealant bridge within the overhang gap between the top wall and the top surface, and the semiconductor package further comprising a die side component (DSC) mounted directly on the package substrate within the overhang gap, wherein the sealant bridge is on the DSC and extends between the top wall and the DSC, and wherein the sealant bridge is further on at least a portion of a vertical sidewall of the DSC.

11. The semiconductor package assembly of claim 10, wherein the DSC is a functional electronic component.

12. The semiconductor package assembly of claim 10, wherein the DSC is a non-functional component.

13. The semiconductor package assembly of claim 10 further comprising a satellite chip mounted on the package substrate within the overhang gap, wherein the sealant bridge extends between the top wall and the satellite chip.

14. A method, comprising:
mounting a semiconductor die directly on a package substrate, wherein the package substrate includes a top surface;
mounting a die side component (DSC) directly on the top surface of the package substrate;
depositing a sealant bridge over the top surface; and
mounting an integrated heat spreader on the package substrate, wherein the integrated heat spreader includes a top wall over the semiconductor die and a sidewall between the top wall and the top surface, and wherein the sealant bridge is within an overhang gap between the semiconductor die and the sidewall, and between the top wall and the top surface, wherein the sealant bridge is on the DSC and extends between the top wall and the DSC, and wherein the sealant bridge is further on at least a portion of a vertical sidewall of the DSC.

15. The method of claim 14, wherein the DSC is a functional electronic component.

16. The method of claim 14, wherein depositing the sealant bridge includes forming a sealant bead laterally around the semiconductor die.

17. The method of claim 14 further comprising mounting a satellite chip on the top surface of the package substrate, and wherein the sealant bridge extends between the top wall and the satellite chip.

* * * * *